United States Patent [19]

Isham et al.

[11] Patent Number: 5,021,747
[45] Date of Patent: Jun. 4, 1991

[54] SYMMETRICAL VARIABLE IMPEDANCE APPARATUS EMPLOYING MOS TRANSISTORS

[75] Inventors: Robert H. Isham, Flemington; Victor Zazzu, Belle Mead, both of N.J.

[73] Assignee: Harris Semiconductor Patents, Inc., Melbourne, Fla.

[21] Appl. No.: 440,187

[22] Filed: Nov. 22, 1989

[51] Int. Cl.$^5$ .............................................. H03G 3/30
[52] U.S. Cl. .................................. 330/284; 307/554; 307/568
[58] Field of Search ................. 330/284; 307/552, 564, 307/568; 333/81 R

[56] References Cited

U.S. PATENT DOCUMENTS 3,763,382 10/1973 Horichi et al. ................. 330/284 X

FOREIGN PATENT DOCUMENTS 72142 6/1977 Japan ..................................... 330/284
1297210 3/1987 U.S.S.R. ............................... 330/284

Primary Examiner—James B. Mullins
Attorney, Agent, or Firm—Henry I. Scharzer

[57] ABSTRACT

A variable impedance element which is utilized to shunt a signal and control the amplitude of the signal utilizes a P-MOS and an N-MOS transistor operated in parallel. Separate control voltages are applied to each device in a direction to lower the impedance of the device with an increase in the peak to peak voltage of the input signal. Thus, by controlling each of the separate shunted transistors from separate peak detectors and according to the polarity of the signal voltage, each transistor will operate somewhat independent from the other to therefore provide accurate gain control and a symmetrical impedance variation.

20 Claims, 3 Drawing Sheets

SYMMETRICAL VARIABLE IMPEDANCE APPARATUS EMPLOYING MOS TRANSISTORS

BACKGROUND OF THE INVENTION

This invention relates to a circuit for providing a symmetrical variable impedance and more particularly to such a circuit used for gain control and employing field effect transistors.

It is known to use metal oxide semiconductor field effect transistors (MOSFETs) as variable impedance elements in gain control circuits. Thus the prior art teaches the use of MOSFET devices as voltage controlled attenuators or voltage controlled resistors for gain control and for other applications as well.

When an MOSFET is used in the ohmic region below the pinch off voltage ($V_p$), the MOSFET functions as a voltage controlled resistor or a voltage variable resistor (VVR). The MOSFET can therefore be used as an attenuator and anywhere a small signal voltage controlled resistor is needed. However, in spite of the widespread uses, care has to be taken in employing the device as a variable resistor due to the non linearities of the transfer characteristics of such a device.

Essentially, the problem will be explained by referring to FIG. 1 which is indicative of a prior art gain control circuit employing MOS transistors. Generally, most prior art implementations utilizing a single MOS or a compound MOS device either suffer from non-linearity, as indicated above, or require substantial class A current for operation. In regard to class A current operation, such a MOS device must be biased in a linear region to assure that current swings occur symmetrically on both sides of the biasing point in order to achieve linear and symmetrical operation within a small range about the quiescent operating point. This essentially specifies class A operation which is well understood in regard to transistors and vacuum tube amplifiers as well.

Referring to FIG. 1, there is shown a prior art type of gain control which has been widely employed. There is a signal source 10 which is a source of an AC signal. The signal source 10 may be an oscillator, amplifier, a communications channel or any other signal source which provides an AC output signal. The output of the signal source 10 is connected to one end of a resistor 11 whose other end is connected to a shunt path comprising a variable resistor device designated generally by reference numeral 12. The variable resistor device 12 has output terminals A and C which are connected between shunt terminal T and a point of reference potential and a control input terminal designated as B.

As shown in FIG. 1, the output signal from the signal source 10 as applied via resistor 11 is applied to the input of a peak detecting circuit 13. There is shown an amplifier A1 having an input coupled to terminal T and an output coupled to the input of the peak detector 13. This amplifier A1 may be omitted in applications where gain is not required, as the source 10 may itself be an amplifier or a gain providing circuit. The peak detecting circuit 13 may be a conventional peak detector and has also applied thereto a reference voltage. The reference voltage enables the peak detector 13 to operate to provide an output to control the impedance of the variable impedance device 12 when the output signal from the amplifier A1 exceeds the predetermined reference value. In this manner the peak amplitude of the signal at the output port (OUT) of the device will be constant as the peak detector, in conjunction with the reference voltage, will control the variable resistance device 12 in a direction to maintain a constant output. FIG. 1 shows two types of variable resistance devices which can be employed in the circuit. Both types utilize MOS transistors. The first type, designated by reference numeral 15, is a single MOS transistor having a drain or source electrode A, a source or drain electrode C and a gate input electrode B. In the case of the N type the more positive electrode is the drain and in the case of the P type the more positive electrode is the source.

In utilizing the MOSFET 15 in place of the circuit module 12, one experiences problems in gain control. The main problem is that the MOS device 15 exhibits non-linear operation due to the non-linear transfer characteristics of a single N- or P-MOS transistor device. These non-linear transfer characteristics are well known and hence variation of the shunt impedance 12 in the circuit depicted will not be a linear function of the control voltage as applied to the gate electrode B. The effective shunt impedance of element 15 varies such that the signal produced at terminal T is not a linear function of the signal source 10. Thus, the output signal is not linearly related to the change or variation in the input source signal.

The problem can be circumvented by a composite device 16 shown in FIG. 1. The composite device includes a first MOS transistor 17 which is connected in series with a second MOS device 18 which device 18 is arranged in a diode configuration. As seen in FIG. 1, the appropriate terminals as A, B and C are indicated for both device 15 and 16 so one will understand how the devices are placed in the circuit shown in FIG. 1.

The device 16 provides more linear operation than the single MOS device 15, as an increasing voltage across either of the two transistors is matched by a decrease across the other so the nonlinearities in the transfer characteristics of the transistors as 17 and 18 tend to cancel. However, the device 16 does require a constant quiescent (Class A) current through both transistors. If excessive currents are drawn through devices 17 and 18, nonlinear operation occurs. It is noted that either N- or P-MOS transistors could be used for modules 15 and 16 provided the appropriate supply voltage is applied to these devices.

Thus, such prior art approaches for providing shunt gain control involve non-linear operation when employing single N- or P-channel MOS devices. When employing composite devices, as for example device 16, one requires operation in a Class A region which requires substantial power dissipation.

Therefore, in circuits embodying the invention there is provided a symmetrical variable impedance which can be employed in a gain control circuit to provide linear operation and which further avoids the necessity of requiring Class A current operation.

Circuits embodying the invention employ complementary field effect transistors having the conduction paths connected in parallel, which combination provides a symmetrical variable impedance when suitably controlled.

BRIEF DESCRIPTION OF THE PREFERRED EMBODIMENT

Apparatus for providing a linear controllable impedance between first and second terminals comprising:

a P-channel field effect transistor (FET) and an N-channel FET, each FET having a source to drain path and a gate electrode with the source to drain paths of each FET connected between said first and second terminals, first means for applying a first signal to said gate electrode of said P-FET for controlling the impedance of said P-FET and second means for applying a second signal to said gate electrode of said N-FET for controlling the impedance of said N-FET to thereby provide a linear impedance between said first and second terminals.

DETAILED DESCRIPTION OF THE INVENTION

Figure 1:
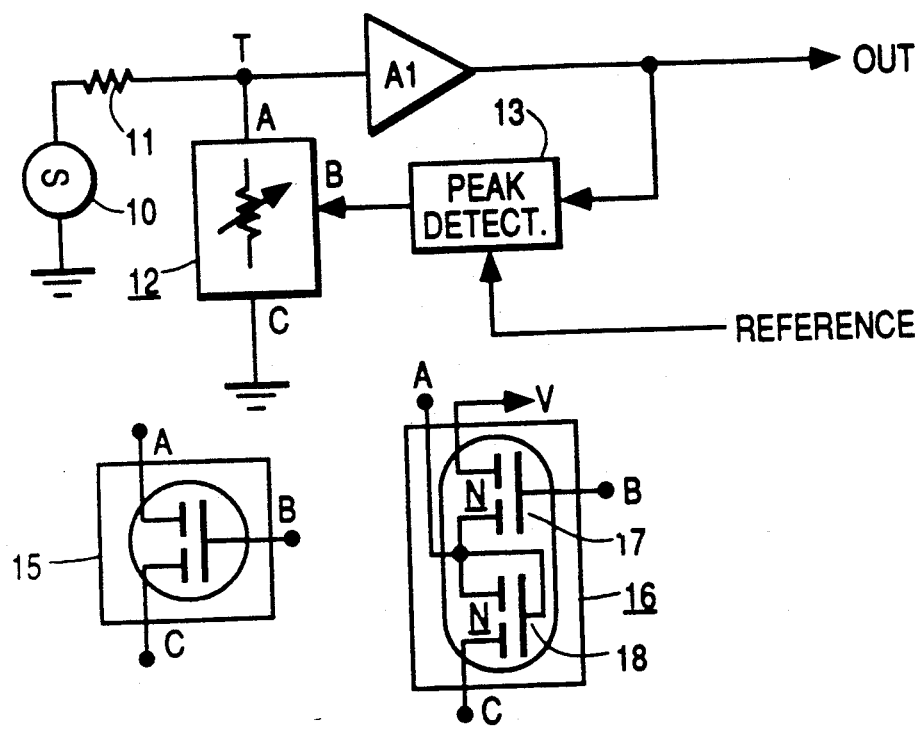
FIG. 1 is a schematic diagram depicting a prior art gain control mechanism utilizing a variable resistor implemented by MOSFET configurations.

The prior art circuits have been described in the Background of Invention with regard to FIG. 1. It is noted that while a main application of this invention is in a shunt gain control circuit, the variable impedance device to be described can be employed in a series gain control mode or be used whenever a symmetrical variable impedance is required.

Figure 2:
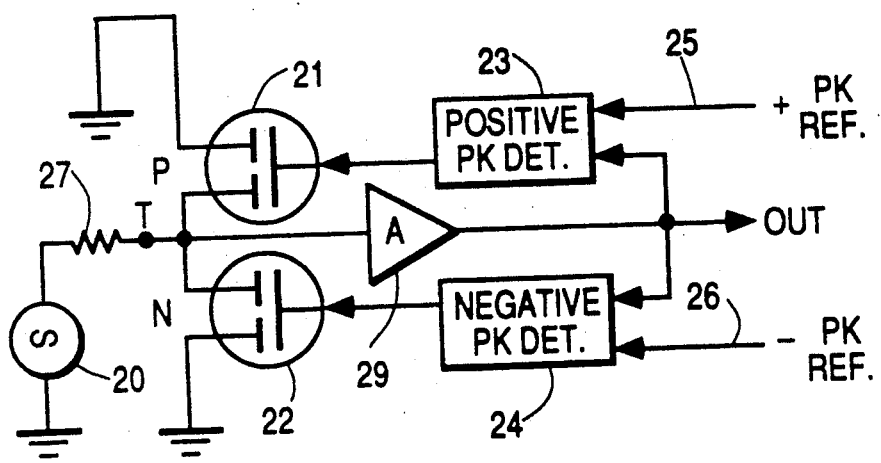
FIG. 2 is a simple block diagram of a circuit operating in accordance with this invention.

Referring to FIG. 2 there is shown a simple block diagram illustrating the present invention. The present invention utilizes both a P-MOSFET (P-MOS) and an N-MOSFET (N-MOS) which are placed in parallel between a terminal T and a point of reference potential. The control voltage for the N-MOS device 22 is derived from a negative peak detector 24 and the control voltage for the P-MOS device 21 is derived from a positive peak detector 23. The operation is appropriate as the P-MOS device will tend to lower impedance as the input source or drain voltage is made more positive because the gate to channel voltage is increased. In a similar manner the N-MOS transistor will exhibit lower impedance as the source or drain voltage is made more negative.

The term peak detection is used for convenience as the circuit includes a comparator and a properly poled diode and associated capacitor. The comparator provides an output when the appropriate polarity peak of the AC signal exceeds the comparator reference voltage. When this occurs, the comparator provides an output which allows the capacitor to transfer charge through the diode. The term peak detection is used to indicate that each comparator responds to the associated AC peaks as negative or positive for the negative and positive comparator thresholds.

By controlling each transistor from respective peak detectors, according to the polarity and magnitude of the monitored signal voltage, each transistor is more effective as each is operated relatively independently and therefore more linear gain control is assured. It is desirable that both transistors as employed in the circuit should be matched as much as possible so that non-linearities will tend to cancel. The matching of the transistors is conveniently afforded by implementing both transistors on the same substrate utilizing well known MOS fabrication techniques.

Hence referring to FIG. 2, there is shown an AC signal source 20 which supplies a signal that is to be maintained at a given peak to peak level at the output (OUT). The signal source 20 is coupled via resistor 27 to the parallel combination of a P-channel device 21 and an N-channel device 22. The P- and N-channel devices have their respective source to drain paths coupled between terminal T and a point of reference potential or to ground as shown; that is, the source of the P device is connected to ground and the source of the N-device is connected to ground. The P device 21 has its gate electrode coupled to the negative output of a positive peak detector 23 while the gate electrode of the N-channel device 22 is coupled to the positive output of a negative peak detector 24. Both the negative and positive detectors 23 and 24 receive the same input voltage which can be applied via the amplifier 29. It is again noted that amplifier 29 may be omitted and hence the input to the detectors 24 and 25 can be obtained directly from resistor 27. The positive peak detector 23 receives a positive peak reference signal designated as +PK.REF on lead 25 while the negative peak detector 24 receives a negative peak reference signal (−PK REF) on lead 26. In this manner the detectors will provide an output when the input signal exceeds the predetermined reference value. In practice, each peak detector 23 and 24 comprises a comparator which provides an output when a comparator threshold level is exceeded. The comparator is followed by a properly poled circuit including a diode and a storage capacitor. Hence, in the case of the positive peak detector 23, the detector includes a positive operated comparator followed by a negatively poled diode circuit as shown in FIG. 3.

Since the P-channel device receives a negative output from the positive peak detector 23, the device 21 will provide a lower impedance as the input voltage is made more positive because the gate to channel voltage is increasing. In a similar manner, the N-MOS transistor 22 will exhibit a lower impedance as the input is made more negative as controlled by the negative peak detector 24. Hence, for given signal magnitudes emanating from the signal source 20, the transistors 21 and 22 operate to provide symmetrical variable impedances during the positive and negative peaks of the input signal. In this manner the parallel combination of the P-channel and N-channel devices will assure that a proper impedance is always in shunt with the controlled terminal T of this circuit to maintain the peak to peak signal level at terminal T constant. This impedance is extremely linear due to the fact that it is a parallel combination of the P- and N- channel impedances, and that the P- and N- channel non-linearities are opposite and tend to cancel. The circuit does not require class A operation and based on the symmetrical impedance variation provides linear gain control. Thus the circuit as shown in FIG. 2 is more effective than the prior art circuits due to the fact that both the N-channel and P-channel devices as 21 and 22 operate independently based on the positive and negative peaks of the input AC signal and therefore more accurate control is assured.

As indicated above, the N-channel and P-channel devices are preferably matched as much as possible so that non-linearities tend to cancel. In this manner both devices as 21 and 22 are fabricated by the same integrated circuit techniques on the same substrate, therefore assuring that the characteristics will in fact be matched.

Figure 3:
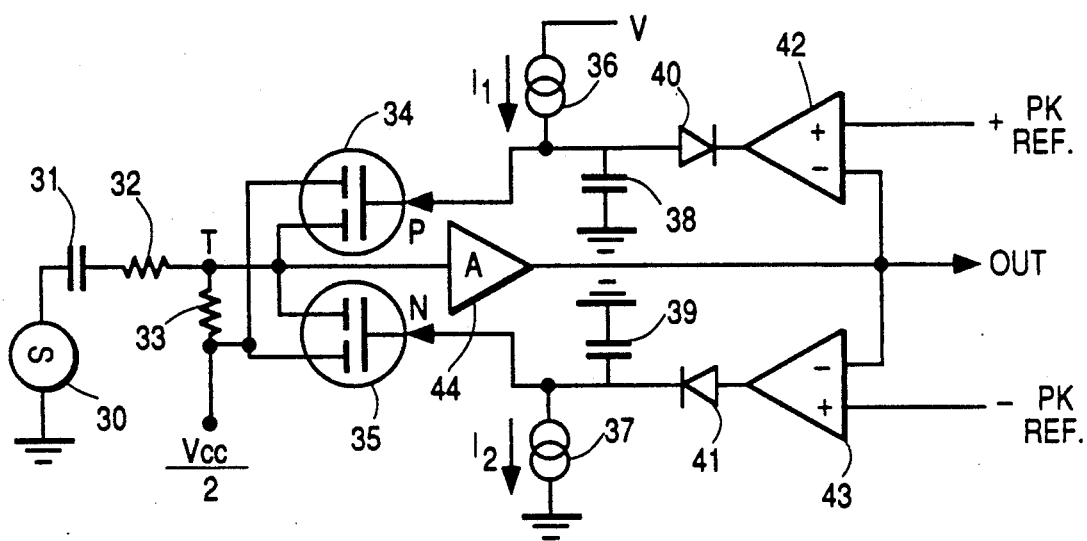
FIG. 3 is a more detailed block diagram of a circuit operating according to this invention.

Referring to FIG. 3 there is shown a more detailed circuit schematic of a gain control apparatus employing a P-channel and N-channel device in parallel to afford linear input to output transfer characteristics over a relatively wide range. As seen in FIG. 3 there is again an AC signal source 30 which is AC coupled via capacitor 31 and resistor 32 to terminal T. The source to drain path of the P-channel transistor 34 is in parallel with the source to drain path of the N-channel device 35 and both paths are connected in parallel with resistor 33 between terminal T and a point of reference potential designated as $V_{cc}/2$. This potential sets the DC level for the circuit. Terminal T also has coupled thereto the input of an amplifier 44. Again, amplifier 44 may be omitted as above indicated. The output of the amplifier 44 is the output of this circuit and is directed to one input of a positive comparator 42 and one input of a negative comparator 43. Each comparator receives a suitable reference potential as + and − and provides an output when the peak of the signal from amplifier 44 exceeds the positive or negative reference. As is known, a comparator can be biased to respond to either positive or negative peaks to provide an output when the threshold reference level is exceeded. Each comparator, as is understood, is followed by a peak detector including the diode and capacitor as above indicated.

The output of comparator 42 is coupled to the cathode of a diode 40 whose anode is coupled to a capacitor 38 and to the gate electrode of P-MOS 34. Capacitor 38 is coupled between the anode of diode 40 and a point of reference potential. In a similar manner, the output of comparator 43 is coupled to the anode of a diode 41 whose cathode is coupled to a capacitor 39 and to the gate electrode of N-MOS 35. Capacitor 39 is coupled between the cathode of diode 41 and a point of reference potential. The diodes and capacitors are arranged in a peak detector format.

There is a first current source 36 ($I_1$) associated with the capacitor 38 and a second current source 37 ($I_2$) associated with the capacitor 39. Such current sources as 36 and 37 can be conveniently and easily implemented by MOSFET circuit configurations and are well known.

The circuit basically operates as follows. The input capacitor 31 prevents DC current flow through resistor 32 while resistor 33 sets the DC signal level at midway between the +PK and −PK references. The current sources I1 and I2, as sources 36 and 37, operate to bleed off current from capacitors 38 and 39 so that with low signal or no signal both transistors 34 and 35 are in the OFF condition. Therefore for low signals transistors 34 and 35 have their respective channels pinched off causing no current to flow through the drain to source path. When the transistors 34 and 35 are biased OFF, there is no attenuation due to the transistors. The input signal as applied via the signal source 30 is amplified by amplifier 44. If the signal exceeds the positive peak reference the comparator 42 goes negative. The negative voltage at the output of comparator 42 causes capacitor 38 to charge through diode 40 thus turning on the P-channel transistor 34. The P-channel transistor 34 will tend to lower the impedance as the input voltage is made more positive because the gate to channel voltage is increasing.

Thus, this operation charges capacitor 38 in the negative direction, turning on the P-channel transistor 34 and hence reducing the input signal level. Capacitor 38 will charge towards the DC level at the output of comparator 42 and hence vary the impedance of P-MOS 34 accordingly. The value of capacitors 37 and 38 are large to provide a time constant greater than the repetition rate of the AC signal. The negative comparator 43 operates to control the N-channel device 35 in the same manner. Hence, when the output of the negative peak detector or comparator 43 goes positive, capacitor 39 is charged via diode 41. This causes the N-channel device 35 to turn on again reducing the signal level for negative peaks which exceed the negative reference level as applied to comparator circuit 43.

Thus, as one can ascertain, by utilizing both a P-MOS and an N-MOS transistor in parallel with the control voltage for the N-MOS device emanating from a negative peak detector and that for the P-MOS device emanating from a positive peak detector symmetrical impedance control is afforded. Thus, by this operation one can provide extremely linear and symmetrical impedance control and hence assure that the signal at the output terminal is held within strict tolerances by the use of the gain control circuit depicted in FIG. 3.

Figure 4:
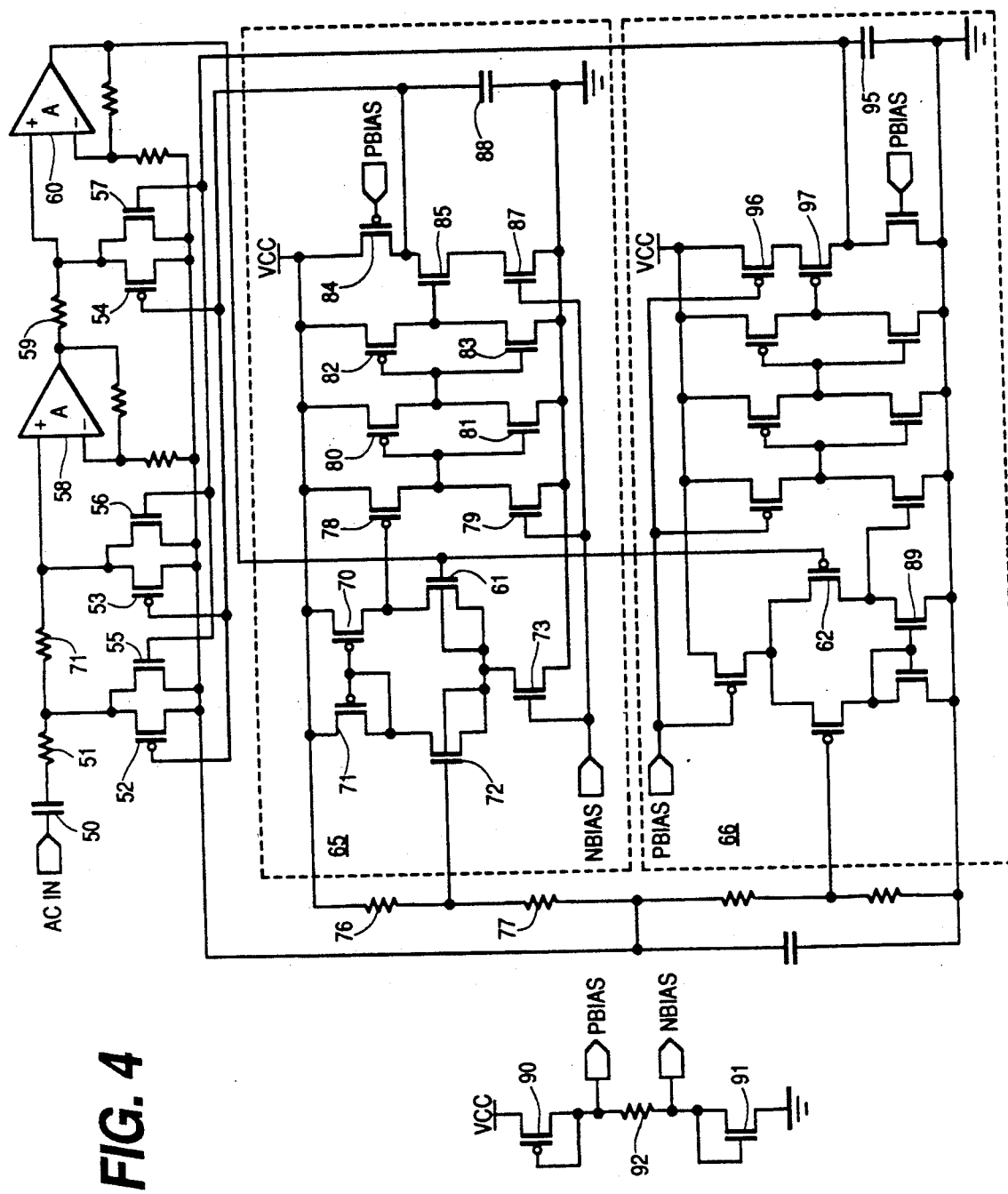
FIG. 4 is a detailed schematic diagram showing a complete circuit operating according to this invention.

Referring to FIG. 4 there is shown a detailed schematic diagram of a complete circuit, as for example the circuit of FIG. 3, which has been actually constructed and implemented according to the above-noted teachings. The input signal is applied via capacitor 50 and a resistor 51. In the circuit shown in FIG. 4 there are three P-channel devices 52, 53 and 54 and three N-channel devices 55, 56 and 57. As will be explained, there are three attenuators provided. Transistors 52 and 55 and resistor 51 form the first attenuator. Transistors 53 and 56 and resistor 71 form the second attenuator, and transistors 54 and 57 and resistor 59 form the third attenuator. The cascoding of attenuators is employed to provide a greater range of input attenuation.

As seen in FIG. 4 there is a first operational amplifier 58 which receives the input signal via the first and second attenuators. The output of operational amplifier 58 is coupled through the third attenuator to an input of operational amplifier 60. Essentially operational amplifier 58 or 60 is equivalent to operational amplifier 44 shown in FIG. 3.

It is understood that the circuit depicted in FIG. 4 is for a particular application using only one supply voltage. The signal ground reference point is set at one half of the supply voltage, and all positive or negative signal voltages are referred to that point.

The output of operational amplifier 60 is coupled to the gate of N-MOS 61 and to the gate of P-MOS 62. MOS devices 61 and 62 are included in separate differential comparator configurations designated as 65 and 66. The comparator circuits 65 and 66 operate as the comparators 42 and 43 of FIG. 3 with circuit 66 being the negative peak detector and circuit 65 the positive peak detector.

As indicated, the differential comparator circuit 65 has the gate of N-MOS 61 connected to the output of the operational amplifier 60. The source to drain path of N-MOS 61 is in series with the source to drain path of P-MOS 70. The source electrode of P-MOS 70 is connected to the source electrode of MOS 71, both of which are connected to the source of potential $V_{cc}$. The P-MOS 71 has its gate connected to the drain and is arranged in a diode configuration with the drain to source path of MOS 71 in series with the drain to source path of MOS 72 which is the other half of the differential comparator. The source electrode of N-MOS 72 is connected to the source electrode of N-MOS 61, both of which are returned to a point of reference potential such as ground through the current source N-MOS 73. N-MOS 73 has its gate electrode coupled to the N bias source.

As can be seen in FIG. 4, to the left thereof is the P-MOS device 90 which is in series with N-MOS device 91 having a resistor 92 coupled between the respective drain to source paths of transistors 90 and 91. In FIG. 4, the P-type devices are identified by a bubble at their gate electrode.

The source of transistor 90 is coupled to the $V_{cc}$ supply and the source of transistor 91 is coupled to ground. In this manner there is provided a bias for the P-MOS devices designated as a P BIAS and a bias for the N-MOS devices designated as a N BIAS. The respective P and N biases are shown in the circuit diagram of FIG. 4. The reference level for the comparator 65 is obtained from the junction between resistors 76 and 77 which junction is connected to the gate of N-MOS 72.

The P-MOS 78 is arranged in series with N-MOS 79. The output of the circuit is taken at the connection between P-MOS 78 and N-MOS 79 and is coupled to the gates of P-MOS 80 and N-MOS 81 arranged in a complementary inverter configuration. The output of the complementary inverter including the P-MOS 80 and N-MOS 81 is coupled to the gates of P-MOS 82 and N-MOS 83 also arranged in a complementary inverter configuration.

The drain to drain connection between P-MOS 82 and N-MOS 83 is connected to the gate of N-MOS 85. N-MOS 85 has its source electrode coupled to the drain electrode of N-MOS 87 wherein the source electrode of N-MOS 87 is connected to the point of reference potential with the gate electrode of N-MOS 87 being coupled to the N BIAS supply. N-MOS 85 can only conduct current in one direction and therefore operates to charge the capacitor 88 accordingly. N-MOS 87 serves as a constant current source to limit the rate at which N-MOS 85 can charge the capacitor 88. The current source for discharging the capacitor is provided by the P-MOS device 84 having the gate electrode connected to the P BIAS supply with the drain electrode connected to $V_{cc}$.

As one can see from FIG. 4, the differential comparator 66 has the same exact configuration as comparator 65 with N-MOS transistors substituted for P-MOS transistors and P-MOS transistors substituted for N-MOS transistors. Thus, as one can see, transistor 62 which is analogous to N-MOS 61 is a P-MOS device. The source to drain path of N-MOS 89 is in series with the source to drain path of P-MOS 62 with the source of N-MOS 89 being connected to the point of reference potential.

As one can see, the circuit shown for the differential comparator 66 is the same circuit shown for the differential comparator 65 with opposite polarity operation. The output capacitor 95 is charged via P-MOS device 97 in series with P-MOS device 96 with the gate of P-MOS device 96 coupled to the P BIAS supply. In this manner capacitor 95 is charged in a single direction. It is seen for example from FIG. 3 that the positive responding peak detector 42 operates to provide a negative charge via diode 40 on capacitor 38 while the negative responding peak detector 43 produces a positive charge via diode 41 on capacitor 39. It is indicated that the comparators 65 and 66 operate accordingly. Thus, the output of comparator 65 which is taken between the source and drain connection of P-MOS 84 and N-MOS 85 is directed to the gate electrodes of the P-MOS devices 52, 53, and 54 in the attenuators. In a similar manner the output of the comparator 66 is taken from the terminal of capacitor 95 and is directed to the gates of the N-MOS devices 55, 56 and 57. Thus, as one can see, the comparator 65 is analogous to comparator 42 of FIG. 3 while comparator 66 is analogous to comparator 43 of FIG. 3. The operation of the circuit is as follows. For an explanation of operation, reference will be made to the operation of comparator 65 and the components associated therewith. It is understood that the comparator 66 operates exactly as described but on the opposite peak voltage.

As seen, the AC input signal is coupled via capacitor 50 in series with resistor 51 and resistor 71 to the input of the amplifier 58. Resistors 51 and 71 are part of the first and second attenuators. Each of the attenuators is quiescently biased so that the transistors associated therewith are all in the off condition for small AC signals. During operation, the attenuators are affected as follows. The AC signal as amplified by amplifier 60 is applied to the gate of N-MOS 61 which forms part of the differential comparator circuit. If the positive peak of the waveform exceeds the reference level as provided by resistors 76 and 77, the comparator 61 will provide an output at the junction between the source and drain of MOS 61 and 70. This output is processed by means of complementary inverters to allow capacitor 88 to provide a negative voltage thereacross which is directed to the gates of P-MOS devices 52, 53 and 54. This voltage P-MOS causes the P-MOS devices to conduct to lower the impedance of the same. Thus, as one can see, the impedance of the P-MOS devices is lowered according to the magnitude of the positive peak of the input AC signal.

In a similar manner the impedances of the N-MOS devices are also lowered according to the magnitude of the negative peaks of the input signal which exceed the comparator reference level. The P- and N-MOS devices each exhibit nonlinear operation over the range of AC signal variation. This non-linear operation is in opposite directions and the combined operation provides a relatively linear impedance over the peak to peak amplitude range of the input AC signal.

It is also noted that the time constant associated with the circuits such as the time constant associated with capacitors 88 and 95 are large as compared to the period of the input AC signal.

The circuit format shown in FIG. 4 is relatively simple and operates to provide symmetrical gain control over a relatively wide range of signals. It is obvious that many additional components in the circuit have not been described in detail as one skilled in the art would have no problem recognizing their function.

It is further indicated that while a shunt attenuator is shown as for example in FIG. 3 and FIG. 4, the same circuit configuration could be utilized as a series attenuator whereby a fixed resistor would be returned to ground and the P- and N-MOS parallel devices would appear in a series arrangement to thereby control attenuation in a similar manner. As one can understand, the circuit is relatively is simple to fabricate due to the fact that the circuits employ the same components and the same circuit configurations. In this manner the entire circuit can be integrated on a single substrate employing MOS techniques.

What is claimed is;

1. Apparatus for providing a linear controllable impedance between first and second terminals comprising:
   a P-channel field effect transistor (FET) and an N-channel FET, each FET having a source to drain path and a gate electrode with the source to drain path of each FET connected between said first and second terminals;
   first means, including first comparator means responsive to the signal at said first terminal having a first polarity and being greater than a given amplitude, coupled to the gate electrode of said P-FET for applying a first control signal to said gate electrode of said P-FET for controlling the impedance of said P-FET, and
   second means, including a second comparator means responsive to the signal at said first terminal having a polarity opposite said first polarity and being greater than a given amplitude, coupled to the gate electode of said N-FET for applying a second control signal to said gate electrode of said N-FET for controlling the impedance of said N-FET, to thereby provide a linear impedance between said first and second terminals.

2. The apparatus according to claim 1 wherein said P- and N-channel FETs are MOSFETs.

3. The apparatus according to claim 2 wherein said P-MOSFET and said N-MOSFET are matched devices.

4. The apparatus according to claim 1 further comprising:
   means coupled to said first terminal adapted to receive an AC input signal from a source, with said second terminal coupled to a point of reference potential; and
   wherein said first comparator means includes a positive peak detector means having an input coupled to said first terminal and for providing said first control signal according to the amplitude of positive peaks of said AC input signal at an output of said peak detector means and means for coupling said output of said positive detector means to said gate electrode of said P-FET; and
   wherein said second comparator means includes a negative peak detector means having an input coupled to said first terminal and for providing said second control signal according to the amplitude of negative peaks of said AC input signal at an output of said negative peak detector means and means for coupling said output of said negative peak detector means to said gate electrode of said N-FET, to thereby vary the impedance of said source to drain path of said P-FET according to the magnitude of positive peaks of said signal and to vary the impedance of said source to drain path of said N-FET according to the magnitude of negative peaks of said signal, to cause the impedance across said first and second terminals to vary symmetrically as controlled by said positive and negative peak detector means.

5. The apparatus according to claim 4 wherein said positive and negative peak detector means are further responsive to reference levels to cause said detector means to provide said output when said AC input signal peaks exceeds a value indicative of said reference levels.

6. The apparatus according to claim 4 wherein said positive and negative peak detector means includes positive and negative comparators each operative to provide said control signal when said associated peaks exceed a comparator reference level.

7. An apparatus for use in a gain controlled system of the type including a source of AC signals for providing a signal output having specified positive and negative peaks with the signal output of said source directed through a first impedance to an output terminal, with said output terminal shunted to a point of reference potential by a variable shunt impedance, with the value of said shunt impedance controlled by peak detector means to vary said shunt impedance according to a control output signal from said peak detector means with said peak detector means having an input coupled to said output terminal to provide said control output signal according to the magnitude of said signal output form said AC source, the improvement therewith comprising a symmetrical variable impedance apparatus for providing said variable shunt impedance, comprising:
   first and second FET devices of opposite conductivity type and having their source to drain paths connected in parallel and shunting said output terminal to said point of reference potential, and each having a gate control electrode and wherein said peak detector means includes a positive peak detector means having an input coupled to said output terminal for receiving said AC signal and for providing at an output a first control signal indicative of the magnitude of positive peaks associated with said AC signal and means for coupling said positive peak detector output to said gate electrode of said first FET device to vary the impedance of said drain to source path of said first device according to said positive peak detection, a negative peak detector means having an input coupled to said output terminal for receiving said AC signal and for providing at an output a second control signal indicative of the magnitude of negative peaks associated with said AC signal and means for coupling said negative peak detector output to said gate electrode of said second FET device to vary the impedance of said drain to source path of said second device according to said negative peak detection, whereby said first and second FETs operate to symmetrically vary the impedance between said output terminal and said point of reference potential according to the impedances of said first and second FETs as varied by said first and second control signals.

8. The apparatus according to claim 7 wherein said first FET device is a P-MOSFET and said second FET device is an N-MOSFET.

9. The apparatus according to claim 8 wherein said P- and N-MOSFETs are matched devices.

10. The apparatus according to claim 7 wherein said positive and negative peak detector means each include a separate comparator means operative to provide an output when a reference input comparison level is exceeded to thereby provide said associated control signal when said comparison level is exceeded.

11. The apparatus according to claim 7 further including an amplifier having an input coupled to said output terminal for providing an amplified version of said AC signal at an amplifier output terminal, with said amplifier output terminal coupled to said input of said positive and negative peak detector means.

12. A gain control apparatus for controlling the gain of an AC signal by providing a controlled linear impedance which varies as a function of the magnitude of said AC signal, comprising:

first and second MOSFETs of opposite conductivity types and having their source to drain paths connected in parallel between an input terminal and a point of reference potential;

means coupled to said input terminal for applying said AC signal thereto;

an amplifier having an input coupled to said input terminal and an output terminal for providing an amplified version of said AC signal;

a first comparator means having an input coupled to said amplifier output terminal and a reference input adapted to receive a first reference potential, said comparator operative to respond to the magnitudes of positive peaks of said AC signal to provide at an output a first control signal when positive peaks of said AC signal exceed said first reference potential, with the output of said first comparator means coupled to the gate electrode of said first MOSFET via a first unidirectional conducting device, with the terminal of said unidirectional device as coupled to said gate electrode of said first MOSFET directed to said point of reference potential via a first capacitor;

a first current source coupled to said gate electrode of said first MOSFET and operative to divert current from said first capacitor to render said first MOSFET in a non-conducting state for positive peak levels below a given value, wherein when said positive peaks of said AC signal are above said first reference potential said first comparator means provides an output signal causing said capacitor to charge via said unidirectional device towards the level of said output signal to thereby cause said first FET to conduct to thereby reduce the impedance between said source to drain and thereby decreasing the AC signal applied to said input terminal in a direction to maintain a constant level AC signal at said output terminal during the positive peaks of said AC signal;

a second comparator means having one input coupled to said amplifier output terminal and a reference input adapted to receive a second reference potential, said second comparator operative to respond to the magnitudes of negative peaks of said AC signal to provide at an output a second control signal when negative peaks of said AC signal exceed said second reference potential, with the output of said second comparator means coupled to the gate electrode of said second MOSFET via a second unidirectional conducting device of opposite polarity to said first device, with the terminal of said second unidirectional device as coupled to said gate electrode of said second MOSFET directed to said point of reference potential via a second capacitor;

a second current source coupled to said gate electrode of said second MOSFET and operative to divert current from said second capacitor to render said second MOSFET in a non-conducting state for negative peak levels below a given value, wherein when said negative peaks of said AC signal are above said second reference potential said second comparator provides an output signal causing said second capacitor to charge via said second unipolar device towards the level of said output signal to thereby cause said second FET to conduct to thereby reduce the impedance between said source to drain and thereby decreasing the AC signal applied to said input terminal in a direction to maintain a constant level signal at said output terminal during said negative peaks of said AC signal;

whereby the impedance afforded by said first and second MOSFETS at said input terminal is linearly controlled by varying the source to drain impedance of said first and second MOSFETs.

13. The gain control apparatus according to claim 12 wherein said first MOSFET is a P-MOS device, with said second MOSFET being an N-MOS.

14. The gain control apparatus according to claim 13 wherein MOSFETs are matched devices.

15. The gain control apparatus according to claim 12 wherein said first and second unipolar devices are MOSFETs, biased to conduct current in a unidirectional manner.

16. The gain control apparatus according to claim 12 wherein said means coupled to said input terminal includes a capacitor in series with a resistor, with said capacitor operative to block DC from being applied to said input terminal by said AC signal.

17. The gain control apparatus according to claim 12 wherein said first reference potential is positive with respect to said second reference potential.

18. The gain control apparatus according to claim 12 further including a third MOSFET in parallel with said first MOSFET and of the same polarity and having the gate electrode of said third MOSFET coupled to the gate electrode of said first MOSFET, and a fourth MOSFET in parallel with said second MOSFET and of the same polarity and having the gate electrode of said fourth MOSFET coupled to the gate electrode of said second MOSFET.

19. The gain control apparatus according to claim 12 further including a voltage divider coupled between a source of operating potential and a point of reference potential and operative to provide said first and second reference potentials at first and second terminals of said voltage divider.

20. The gain control apparatus according to claim 12 wherein said first and second capacitors are equal in value.

* * * * *